United States Patent
Haggard et al.

[11] Patent Number: 6,030,232
[45] Date of Patent: Feb. 29, 2000

[54] HIGH DENSITY ELECTRICAL CARD CONNECTOR SYSTEM

[75] Inventors: J. Eric Haggard, Elgin; Garrett R. Trotter, Aurora, both of Ill.

[73] Assignee: Universities Research Association, Inc., Washington, D.C.

[21] Appl. No.: 08/924,980

[22] Filed: Sep. 8, 1997

[51] Int. Cl.[7] .................................................. H01R 9/09
[52] U.S. Cl. ............................................. 439/64; 439/260
[58] Field of Search ............................... 439/64, 61, 260, 439/267, 377

[56] References Cited

U.S. PATENT DOCUMENTS

| | | | |
|---|---|---|---|
| 3,495,132 | 2/1970 | Anhalt et al. | 439/64 |
| 4,047,782 | 9/1977 | Yeager | 439/267 |
| 4,390,224 | 6/1983 | Showman et al. | 439/264 |
| 4,553,803 | 11/1985 | Lapraik et al. | 439/260 |
| 4,603,928 | 8/1986 | Evans | 439/64 |
| 4,606,594 | 8/1986 | Grabbe et al. | 439/267 |
| 4,744,764 | 5/1988 | Rubenstein | 439/62 |
| 4,818,240 | 4/1989 | Karner | 439/64 |
| 4,834,665 | 5/1989 | Kreinberg et al. | 439/260 |
| 4,846,699 | 7/1989 | Glover et al. | 439/64 |
| 5,086,372 | 2/1992 | Bennett et al. | 361/415 |
| 5,626,480 | 5/1997 | Baumbaugh | 439/64 |

FOREIGN PATENT DOCUMENTS

WO 85/02499  6/1985  WIPO .

*Primary Examiner*—Hien Vu
*Attorney, Agent, or Firm*—McAndrews, Held & Malloy, Ltd.

[57] ABSTRACT

An electrical circuit board card connection system is disclosed which comprises a wedge-operated locking mechanism disposed along an edge portion of the printed circuit board. An extrusion along the edge of the circuit board mates with an extrusion fixed to the card cage having a plurality of electrical connectors. The connection system allows the connectors to be held away from the circuit board during insertion/extraction and provides a constant mating force once the circuit board is positioned and the wedge inserted. The disclosed connection system is a simple solution to the need for a greater number of electrical signal connections.

6 Claims, 3 Drawing Sheets

HIGH DENSITY ELECTRICAL CARD CONNECTOR SYSTEM

This invention was made with Government support under Government Contract No. DE-AC02-76CH03000 awarded by the U.S. Department of Energy. The Government has certain rights in the invention.

FIELD OF THE INVENTION

The present invention relates go electrical connectors for removable printed circuit boards. More particularly, the present invention relates to a zero insertion/extraction force connector along an edge of a printed circuit board capable of supplying 1000 or more electrical signal connections.

BACKGROUND OF THE INVENTION

As computational demands increase, there is a growing need for a large number, i.e., greater than 600, of electrical signal connections for removable printed circuit boards. Typically, removable printed circuit boards are inserted into a card cage or expansion slot of a computer. Often, these printed circuit boards, or daughter cards, are connected to the motherboard of a computer through the backplane of the card cage. Electrical circuitry on the circuit boards connects to the backplane by any of several types of known connectors and terminals. The circuit boards are thereby interconnected by the backplane to circuitry of other circuit boards in the array of slots and/or to other circuitry within the computer. The circuit boards are, therefore, limited by the number of electrical connections available on the backplane.

For example, printed circuit boards of the Eurocard 9U by 400 mm format have three 96 pin DIN connectors along their back edge. Most of these connections are dedicated to VME signal lines and power supplies. Thus, at most, approximately 100 connections are available for non-standard power supplies and signal connections. The complexity of today's computers demand more connections to exchange power and electrical signals.

One solution is to add connections to the front of the circuit board. Adding connections to the front edge of the circuit board is possible; however, it is not practical for large systems. The associated cabling would make circuit board removal and replacement very difficult.

An example of a high density printed circuit board card connection system is described in Baumbaugh U.S. Pat. No. 5,626,480. The '480 patent describes a zero insertion/extraction force printed circuit board card connection system which includes a cam-operated locking mechanism disposed along an edge portion of the printed circuit board.

The present printed circuit board connection system addresses the need for increased signal connections with a simple mechanical arrangement that includes a wedge-operated connector along an edge portion of a printed circuit board.

It is therefore an object of the present invention to provide a card connection system having 1000 or more electrical signal connections disposed along an edge of a printed circuit board other than the back edge.

Another object of the present invention is to provide electrical connections that are able to be mated after insertion, yet separable during circuit board insertion and extraction.

A further object of the present invention is to provide a card connection system which provides adequate ventilation when a plurality of circuit boards including the present connection system are installed as an array within a card cage.

SUMMARY OF THE INVENTION

The above and other objects are achieved by a large scale, high density electrical printed circuit board card connection system including a wedge-operated connector along an edge portion of a printed circuit board.

In one embodiment of the present connection system, an electrical connector for introducing electrical signals to a circuit board comprises:

(a) a first extrusion attached to an edge portion of a circuit board having a plurality of electrical signal receiving locations along an edge thereof, the first extrusion and circuit board defining an interior channel having an opening at one end;

(b) a second extrusion attached to a housing for receiving the circuit board, the second extrusion being inserted through the opening and moved along the length of the channel, the second extrusion further including a plurality of electrical contacts and a resilient surface; and (c) a wedge disposed between the first and second extrusions slidably engaging the resilient surface such that insertion of the wedge urges the second extrusion between first and second positions.

In operation, movement of the second extrusion into the first position urges the plurality of electrical contacts apart from the plurality of electrical signal receiving locations and movement of the second extrusion into the second position urges the plurality of electrical contacts to engage the plurality of electrical signal receiving locations.

A method of providing electrical connections to a circuit board comprises the steps of:

(a) attaching a first extrusion to an edge of a circuit board having a plurality of electrical signal receiving locations along an edge thereof, the first extrusion and circuit board defining an interior channel having an opening at one end;

(b) attaching a second extrusion to a housing for receiving the circuit board, the second extrusion having a plurality of electrical contacts and a resilient surface;

(c) inserting the second extrusion into the channel such that the plurality of electrical contacts align with and oppose the plurality of electrical signal receiving locations; and, (d) inserting a wedge between the first and second extrusions slidably engaging the resilient surface such that insertion of the wedge member curses the plurality of electrical contacts to engage the plurality of electrical signal receiving locations.

DETAILED DESCRIPTION OF A PREFERRED EMBODIMENT

In the present application, spatially orienting terms are used such as "front," "top," "bottom," "back, " and the like.

It is to be understood that these terms are used for convenience of description of the preferred embodiments by reference to the drawings. These terms do not necessarily describe the absolute location in space, such as front top, bottom, upward, downward, etc., that any part must assume.

Figure 1:
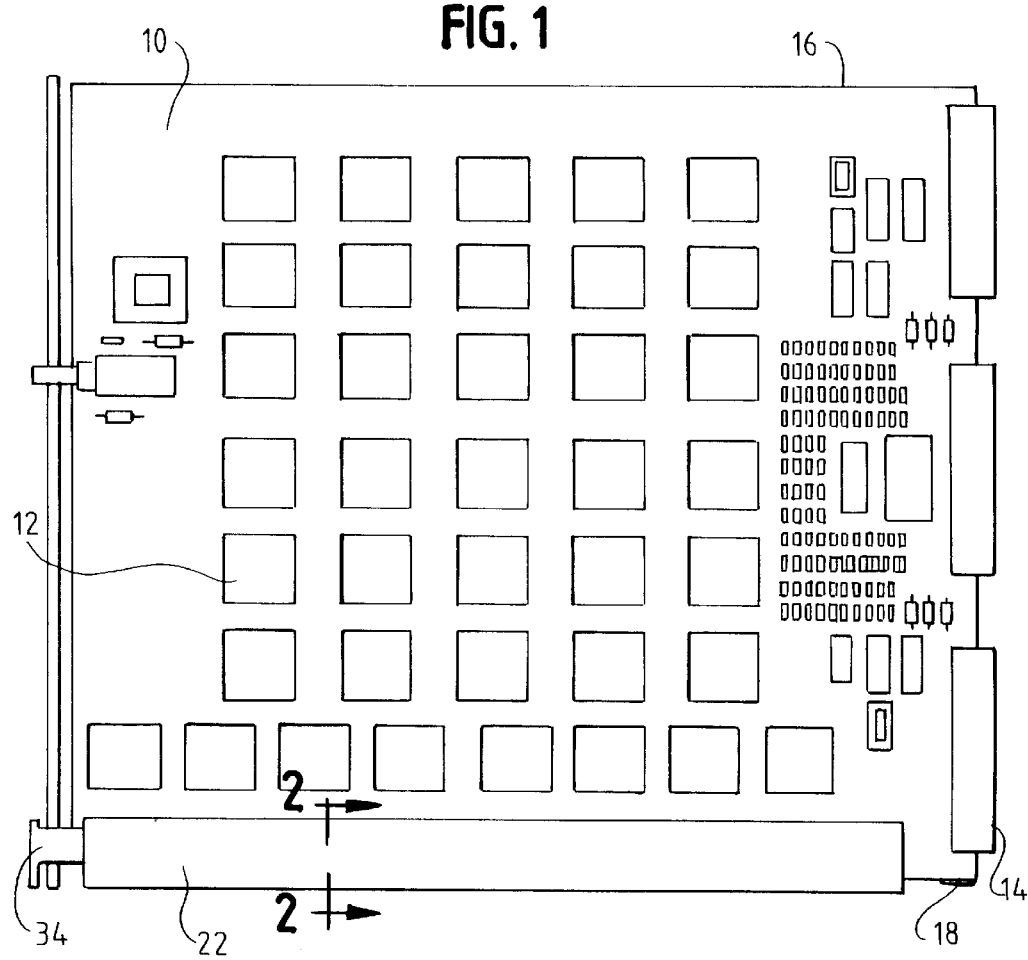
FIG. 1 is a side view of a circuit board including the card connection system of the present invention.

FIG. 1 shows a representative printed circuit board having a plurality of integrated circuit chips 12 attached thereto. In standard 9U by 400 mm (14.437 by 15.750 inch) Eurocard format, for example, three 96 pin DIN connectors 14 are provided along the back edge of the printed circuit board 10. Typically, most of the connections provided by the DIN connectors 14 are used for VME signal lines and power supplies. Thus, there are relatively few connections available for non-standard power supplies or signal lines.

The printed circuit board 10 includes upper and lower card guide areas 16 and 18. The card guides 16, 18 provide a flange for insertion into corresponding slots in a card cage. The printed circuit board 10 can thus be mounted in a card cage by inserting the card guides 16, 18 into their respective mounting rails 38 (see FIGS. 2 and 3) and sliding the printed circuit board 10 until the DIN connectors 14 engage the backplane of the card cage.

Figure 2:
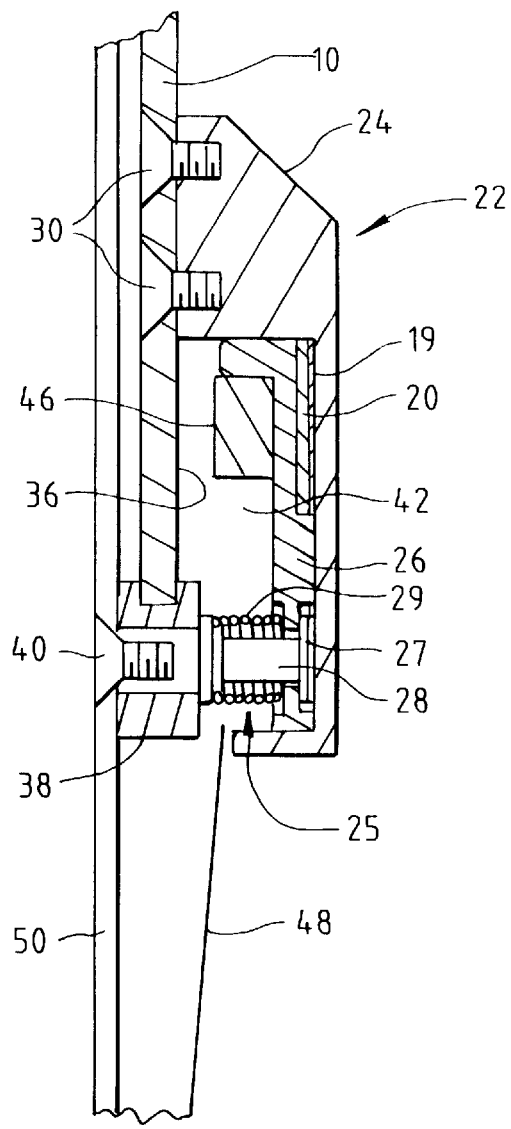
FIG. 2 is section view of the wedge-operated connector of FIG. 1, taken in the direction of arrows 2—2 in FIG. 1.
Figure 3:
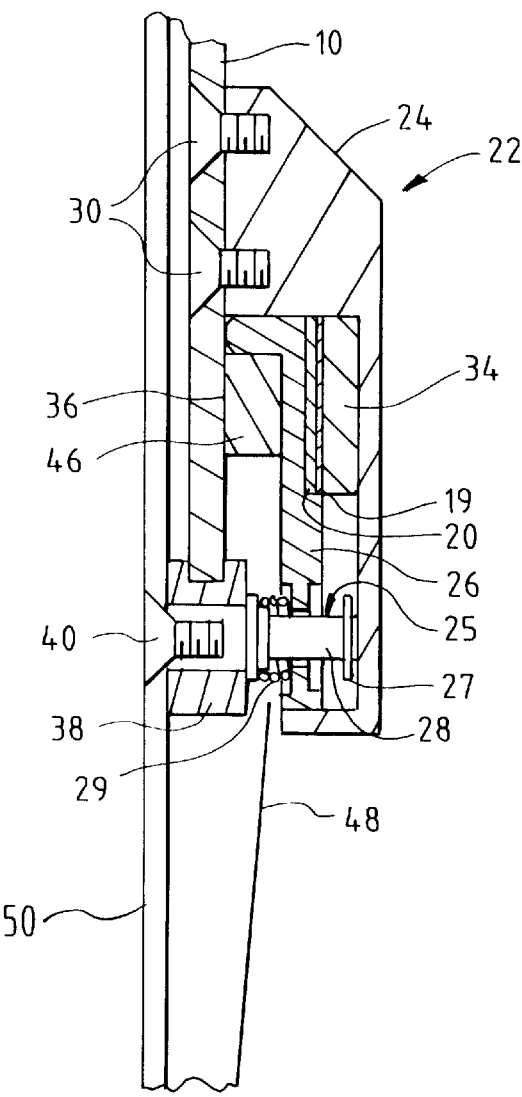
FIG. 3 is an end view of the card connection system of FIG. 2 with the wedge fully inserted and the electrical contacts engaged.

In order to provide additional electrical contacts, the printed circuit board 10 includes a wedge-operated connector 22. FIG. 2 is a section view of the wedge-operated connector 22 of FIG. 1 taken along line 2—2 without the wedge in place. FIG. 3 is a sectional view of the wedge-operated connector 22 of FIG. 1 taken along line 2—2 with the wedge 34 fully inserted and the electrical contacts 46 fully engaged with the signal receiving locations 36 of the printed circuit board 10.

Referring to FIG. 2, the printed circuit board 10 is shown having a first extrusion 24 attached to the printed circuit board 10 by fasteners 30. The printed circuit board 10 further includes a plurality of signal receiving locations 36 distributed along the lower edge. The number and location of these signal receiving locations is dependent upon the number of additional connections desired between the mother board and the printed circuit board 10. The printed circuit board 10 is mounted into the card cage 50 by slidably engaging the card guides 16, 18 (see FIG. 1) with the mounting rail 38, as shown in FIGS. 2 and 3. Mounting rail 38 is attached to the card cage 50 by fasteners 40.

The configuration of the first extrusions 24 creates an interior channel 42 for engaging a second extrusion 26 carrying a plurality of electrical contacts 46 from the mother board or card cage 50.

Second extrusion 26 further includes a resilient surface 20 for slidably engaging wedge 34 as shown in FIG. 3. With wedge 34 inserted, resilient surface 20 supplies a compressive force for engaging contacts 46 against signal receiving locations 36 of the circuit board 10. Resilient surface 20 shown in FIGS. 2 and 3 is preferably constructed of a friction-tolerant material such as spring steel. Resilient surface 20 may also be mated with an elastomer 19, as shown in FIGS. 2 and 3, to provide a compliant compressive force to mate contact 46 with signal receiving location 36.

The representative contact 46 receives signals or power from below via a ribbon cable 48 or flexible printed circuit board. In the preferred embodiment, the contacts 46 are constant-mating-force contacts such as those known and commercially available.

One example of such a contact is the Cin-apse contact manufactured by the Cinch Corporation. These contacts are preferable because they have no insertion or extraction force. The Cin-apse contacts 46, while having very low impedance and high density, are not tolerant of any longitudinal rubbing or wiping action. Therefore, the present card connection system allows for the contacts 46 to be pressed against the printed circuit board 10 to make electrical contact, and held away from the printed circuit board 10 during insertion or extraction.

As shown in FIG. 2, the spring assembly 25 holds the Cin-apse contacts away from the circuit board during insertion and extraction. Spring assembly 25 comprises a spring 29, a guidepost 28, and retaining ring 27. The spring 29, guide post 28 and retaining ring 27 are arranged as shown in FIG. 2, such that the spring 29 biases the body of the second extrusion 26 against retaining ring 27 during insertion or extraction.

Insertion of wedge 34 causes the spring 29 to compress, thereby allowing the body of the second extrusion 26 and associated electrical contact 46 to travel in a direction parallel to the axis of the guide post 28 toward the circuit board 10 and associated signal receiving location 36.

Although Cinch Cin-apse contacts are preferred, any of a multitude of electrical contacts could be used including elastomeric connectors and simple pins and sockets.

Similarly, any number of biasing means could be used in place of spring assembly 25 to separate contact 46 from signal receiving locations 36 during insertion and extraction of the circuit board 10. Such alternative biasing means include plastic leaf springs and stand-offs.

In operation, the printed circuit board 10 is slid into the card cage such that the first and second extrusions 24, 26 mate. In this regard, the interior channel 42 created by the first extrusion 24 on the printed circuit board engages the second extrusion 26 as shown in FIG. 2.

Referring to FIG. 2, the second extrusion 26 is shown in the insert/extract position. In this position, the contacts 46 carried by the second extrusion 26 are held away from the signal receiving locations 36 of the printed circuit board 10 by the spring assembly 25 of the second extrusion 26. Accordingly, there is no longitudinal rubbing or wiping action on the contacts 46 during insertion or extraction of the printed circuit: board 10.

Once the printed circuit board 10 is installed, the wedge 34 is inserted between the resilient surface 20 and the first extrusion 24 as shown in FIG. 3. Insertion of the wedge 34 urges the second extrusions 26 and corresponding contacts 46 toward the printed circuit board 10. With the wedge 34 fully inserted as shown in FIGS. 1 and 3, the contacts 46 an signal receiving locations 36 are electrically engaged.

To remove the printed circuit board 10, the wedge 34 is slidably removed, thereby allowing the second extrusion 26 to return to the insert/extract position, holding the contacts 46 away from the signal receiving locations 36 of the printed circuit board 10.

Since the extrusions and the wedge 34 run the entire length of the printed circuit board 10, the mating force is applied along the entire edge of the printed circuit board. Thus, even minor warpage of the circuit board does not affect the integrity of the electrical connection. The extrusions insure compliant contact along the length of the circuit board. Longitudinal alignment is achieved by placing alignment pins at several points along the length of the circuit board.

The Cin-apse contacts of the preferred embodiment are available in many densities and can be obtained in custom configurations. Thus, more than 1000 connections can easily be brought onto the bottom edge of the printed circuit board.

The discloses connection system can also be used on the top edge of the circuit board to provide an even greater number of connections.

Figure 4:
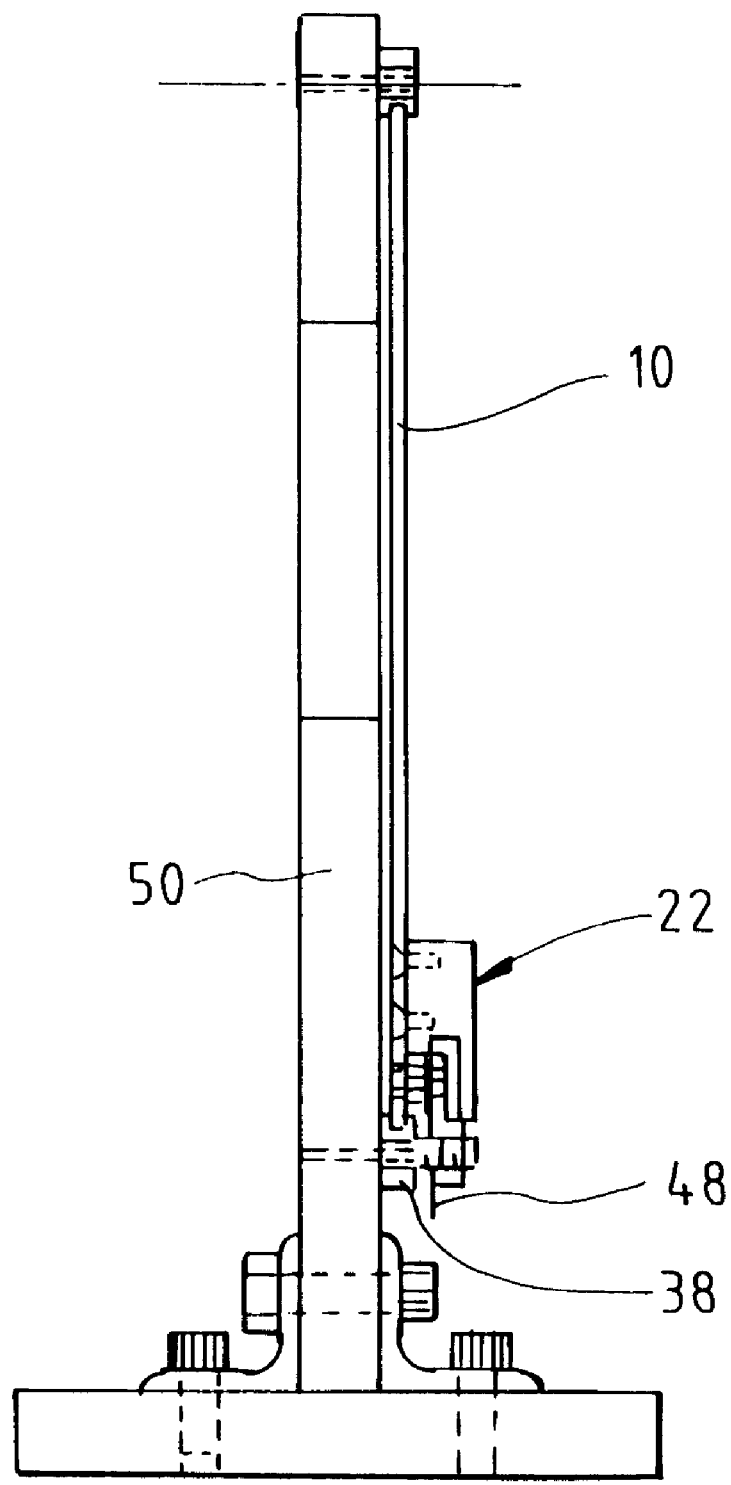
FIG. 4 is a partial view of a card cage including an array of circuit boards employing the card connection system of the present invention.

As shown in FIG. 4, the disclosed connection system can be accomplished in a narrow space, thus allowing adequate space for airflow between the circuit boards.

Other variations of the present card connection system will suggest themselves to persons skilled in this technical field. For example, the extrusions could be of any configuration depending upon space limitations and the relevant amount of lateral movement desired. Likewise, it is readily understood that the present card connection system could be used along any edge of a removable printed circuit board.

The present zero insertion/extraction force card connection system has a simplified construction and allows for increased electrical connections relative to previous systems. The present card connection system also provides an economical solution to the need for more signal connections. The present card connection system also overcomes the problem of hard wiring more connections or being limited by the connections available on the backplane of the card cage.

The present card connection system provides several advantages over conventional card connectors. A greater number of connections are provided between the circuit board and motherboard. In addition to the backplane, connections can be made along the top or bottom edges of the circuit board. Further, the present connection system allows for zero insertion/extraction force from the front of the card cage, as is typical with many standardized formats today.

While particular elements, embodiments and applications of the present invention have been shown and described, it will be understood, of course, that the invention is not limited thereto since modifications may be made by those skilled in the art, particularly in light of the foregoing teachings. It is therefore contemplated by the appended claims to cover such modifications that incorporate those features that come within the spirit and scope of the invention.

What is claimed is:

1. An electrical connector for introducing electrical signals to a circuit board, the connector comprising:

(a) a first extrusion attached to an edge portion of a circuit board having a plurality of electrical signal receiving locations along an edge thereof, said first extrusion and circuit board defining an interior channel having a longitudinal length and an opening at one end of said longitudinal length;

(b) a second extrusion attached to a housing for mounting said circuit board, said housing receiving said circuit board in a mounting channel formed in said housing, said second extrusion being insertable through said opening and extendible along said length of said interior channel, said second extrusion further including a plurality of electrical contacts and a resilient surface, said second extrusion being spring-biased such that said contacts are normally out of contact with said plurality of electrical signal receiving locations; and (c) a wedge member insertable between said first and second extrusions, said wedge member slidably engaging said resilient surface such that insertion of said wedge member urges said second extrusion from a first position to a second position;

whereby insertion of said wedge member between said first and second extrusions urges said plurality of electrical contacts into contact with said plurality of electrical signal receiving locations.

2. The electrical connector of claim 1 wherein the plurality of electrical contacts are constant mating force contacts.

3. The electrical connector of claim 1 wherein said second extrusion moves along a longitudinal length of said channel as the circuit board is inserted into the housing.

4. The electrical connector of claim 1 wherein said resilient surface comprises steel mated to an elastomer.

5. The electrical connector of claim 1 wherein said second extrusion further comprises means for urging said second extrusion into said first position upon insertion into said opening.

6. The electrical connector of claim 5 wherein said means for urging includes a spring and guidepost.

* * * * *